United States Patent
Kim et al.

(10) Patent No.: US 8,476,682 B2
(45) Date of Patent: Jul. 2, 2013

(54) IMAGE SENSOR

(75) Inventors: Do Hwan Kim, Anyang-si (KR); Woong Choi, Seongnam-si (KR); Kyung Bae Park, Seoul (KR); Kyu Sik Kim, Jeonju-si (KR); Yong Wan Jin, Seoul (KR); Kwang Hee Lee, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 5 days.

(21) Appl. No.: 13/224,613

(22) Filed: Sep. 2, 2011

(65) Prior Publication Data

US 2012/0261649 A1 Oct. 18, 2012

(30) Foreign Application Priority Data

Apr. 15, 2011 (KR) .................. 10-2011-0035301

(51) Int. Cl.
*H01L 27/48* (2006.01)

(52) U.S. Cl.
USPC ............................................. 257/233

(58) Field of Classification Search
USPC ............................ 257/40, 233, 226
See application file for complete search history.

(56) References Cited

U.S. PATENT DOCUMENTS

| | | | |
|---|---|---|---|
| 6,818,328 B2 * | 11/2004 | Utsumi et al. | 428/690 |
| 6,932,665 B2 * | 8/2005 | Makifuchi et al. | 445/24 |
| 7,135,816 B2 * | 11/2006 | Kawaguchi et al. | 313/506 |
| 2004/0200972 A1 | 10/2004 | Nam et al. | |
| 2005/0020174 A1 * | 1/2005 | Makifuchi et al. | 445/24 |
| 2006/0119724 A1 * | 6/2006 | Inuiya | 348/311 |
| 2007/0095391 A1 * | 5/2007 | Sun | 136/263 |
| 2007/0109571 A1 * | 5/2007 | Kawamura | 358/1.9 |
| 2008/0316410 A1 * | 12/2008 | Fujii et al. | 349/139 |
| 2009/0084444 A1 * | 4/2009 | Sun | 136/263 |
| 2009/0283807 A1 * | 11/2009 | Adkisson et al. | 257/292 |
| 2010/0096677 A1 * | 4/2010 | Inoue | 257/294 |
| 2010/0140623 A1 * | 6/2010 | Min et al. | 257/59 |
| 2011/0079817 A1 * | 4/2011 | Ohara | 257/103 |

* cited by examiner

*Primary Examiner* — Thao P. Le

(74) *Attorney, Agent, or Firm* — Harness, Dickey & Pierce, P.L.C.

(57) ABSTRACT

An example embodiment of the image sensor includes a light-sensing device including a first electrode, a second electrode disposed opposite to the first electrode, and a photoelectric conversion layer positioned between the first electrode and the second electrode. The photoelectric conversion layer includes a block copolymer including electron donating blocks and electron accepting blocks. The electron donating blocks are deposited together and connected to the first electrode and the second electrode. The electron accepting blocks are deposited together and connected to the first electrode and the second electrode. A color filter may be positioned on the second electrode of the light-sensing device.

20 Claims, 4 Drawing Sheets

B A B A B A

IMAGE SENSOR

CROSS-REFERENCE TO RELATED APPLICATION

This application claims priority under 35 U.S.C. §119 to the benefit of Korean Patent Application No. 10-2011-0035301 filed in the Korean Intellectual Property Office on Apr. 15, 2011, the entire contents of which are incorporated herein by reference.

BACKGROUND

1. Field

Some example embodiments relate to an image sensor.

2. Description of the Related Art

An image sensor is a device that includes photoelectric conversion devices and converts light into an electric signal according to the intensity of light received. The image sensor may be used in a digital input device to record non-digitalized images into digital images. The demand for image sensors in digital still and mobile cameras, camera phones, web cameras, and surveillance cameras is increasing with rapidly changing technologies.

The image sensor may include a pixel array including a plurality of pixels arranged in a matrix format, and each pixel includes a light-sensing device and a transmission and signal output device. Although image sensors based on a charge coupled device (CCD) have been a dominant technology, recent advances of image sensors implemented in a complementary metal oxide semiconductor (CMOS) technology have led to their adoption in several high-volume products, such as personal computer cameras, camera phones, and digital cameras, making CMOS image sensors a viable alternative to CCD technology.

Both CCD and CMOS image sensors collect external light through a microlens, and the collected light is transmitted to the light-sensing device such as a photodiode and thus a signal is output. The unique feature of the CMOS image sensor is that each pixel contains transistors to amplify the electrical signal, which provides various advantages such as less noise during signal transition, compact size, faster image processing, lower power consumption, and lower manufacturing cost.

As the demand for higher resolution image sensors increases, pixel size has been reduced to integrate more pixels within the given area. However, as the pixel becomes smaller, the pixels receive a lesser amount of light and the pixel's high aspect ratio allows more crosstalk of the electrical and optical signals, resulting in degraded image quality. Therefore, to keep continuously scaling down the pixels, it is desirable to improve photoelectric conversion efficiency of the pixel and to reduce the crosstalk between pixels in CMOS image sensors.

SUMMARY

At least one example embodiment relates an image sensor with excellent photoelectric conversion efficiency, life-span characteristics, long-term reliability, and/or low crosstalk.

According to an example embodiment, an image sensor includes: a light-sensing device including a first electrode, a second electrode disposed opposite to the first electrode, and a photoelectric conversion layer positioned between the first electrode and the second electrode; and a color filter positioned on the second electrode of the light-sensing device. Wherein the photoelectric conversion layer includes a block copolymer composed of an electron donating block and an electron accepting block, the electron donating blocks are deposited together and connected to the first electrode and the second electrode, and the electron accepting blocks are deposited together and connected to the first electrode and the second electrode.

The image sensor may include a plurality of color filters, and may include a plurality of first electrodes disposed opposite to each color filter and separated from each other.

In the image sensor, the electron donating block and the electron accepting block may be respectively deposited in parallel to the first electrode and the second electrode, and connected to the first electrode and the second electrode.

The photoelectric conversion layer may be formed of the electron donating block and the electron accepting block phase-separated as a lamellar type or a cylinder type.

Particularly, the electron donating block may include polyaniline, polypyrrole, polythiophene, polythiazole, poly (p-phenylenevinylene), MEH-PPV (poly[2-methoxy-5-(2'-ethyl-hexyloxy)-1,4-phenylene vinylene), MDMO-PPV (poly(2-methoxy-5-(3,7-dimethyloctyloxy)-1,4-phenylene-vinylene), pentacene, poly(3,4-ethylenedioxythiophene) (PEDOT), metal phthalocyanine, poly(3-alkylthiophene), or a combination thereof.

The electron donating block may have a weight average molecular weight (Mw) of about $1\times10^3$ g/mol to about $1\times10^6$ g/mol, and a polydispersity index (PDI) of about 1 to about 2.

Particularly, the electron accepting block may include fullerene (C60, C70, C74, C76, C78, C82, C84, C720, C860), 1-(3-methoxy-carbonyl)propyl-1-phenyl (6,6)C61 (PCBM), C71-PCBM, C84-PCBM, bis-PCBM, perylene, a perfluoropolymer, or a combination thereof.

The electron accepting block may have a weight average molecular weight (Mw) of about $1\times10^3$ g/mol to about $1\times10^6$ g/mol, and a polydispersity index (PDI) of about 1 to about 2.

In the block copolymer, the ratio of the weight average molecular weight of the electron donating block and the weight average molecular weight of the electron accepting block may be about 2:8 to about 8:2.

Further, the block copolymer may include the electron donating block and the electron accepting block in the weight ratio of about 2:8 to about 8:2.

The photoelectric conversion layer may have a thickness of about 10 nm to about 5000 nm.

The image sensor may further include a neutral surface layer between the first electrode and the photoelectric conversion layer, and the neutral surface layer may have surface energy of about 20 N/m to about 60 N/m.

The image sensor may further include an anti-reflection coating positioned between the light-sensing device and the color filter.

The image sensor may further include a microlens positioned on the color filter.

Hereinafter, further embodiments will be described in detail.

BRIEF DESCRIPTION OF THE DRAWINGS

The foregoing and other features and advantages of the example embodiments will be apparent from the more particular description of non-limiting embodiments, as illustrated in the accompanying drawings in which like reference characters refer to the same parts throughout the different views. The drawings are not necessarily to scale, emphasis instead being placed upon illustrating the principles of the example embodiments. In the drawings.

DETAILED DESCRIPTION

Figure 1:
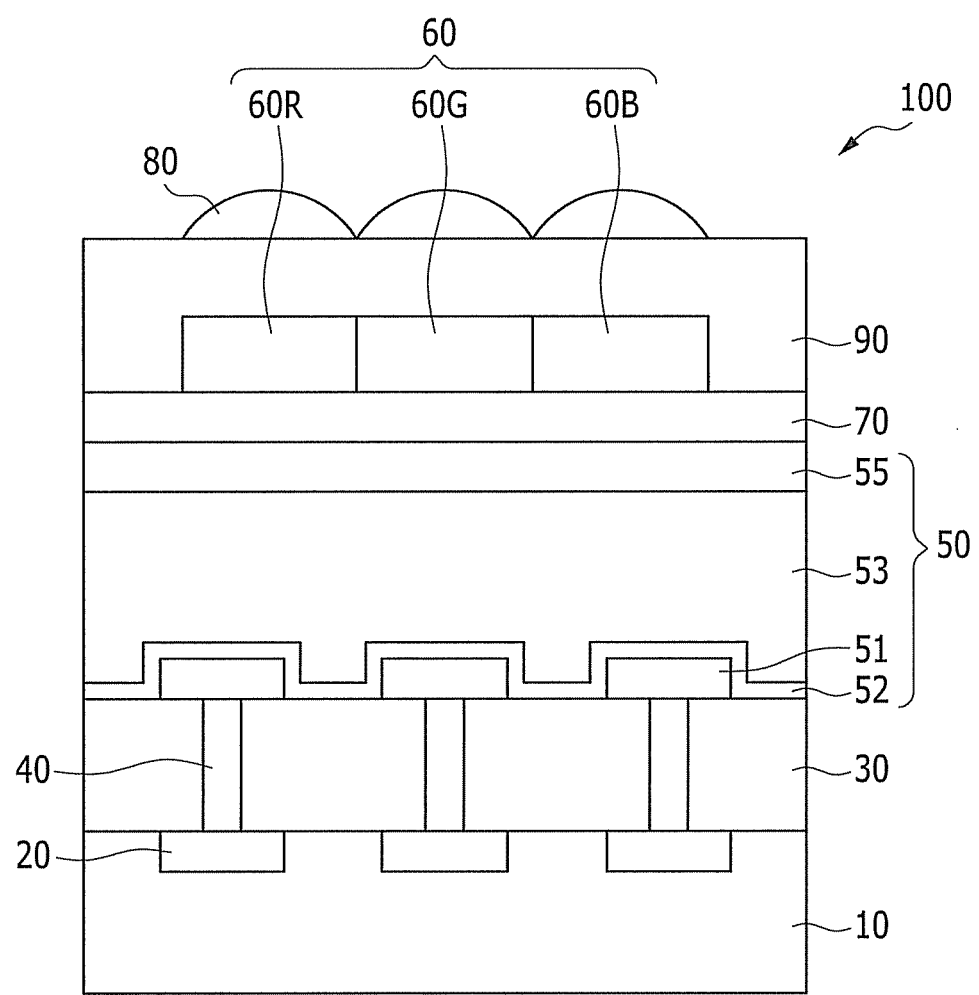
FIG. 1 is a cross-sectional view schematically showing the CMOS image sensor according to an example embodiment.

Example embodiments will be described more fully hereinafter in the following detailed description, in which some but not all embodiments of this disclosure are described. This disclosure may be embodied in many different forms and is not construed as limited to the embodiments set forth herein; rather, these embodiments are provided so that this disclosure will satisfy applicable legal requirements.

In the drawings, the thickness of layers, films, panels, regions, etc., are exaggerated for clarity. Like reference numerals designate like elements throughout the specification. It will be understood that when an element such as a layer, a film, a substrate, and the like is referred to as being "on" another element, it can be directly on the other element or intervening elements may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device, in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, referring to FIGS. 1 to 4, an image sensor according to an example embodiment is described.

FIG. 1 is a cross-sectional view schematically showing the CMOS image sensor according to an example embodiment.

In FIG. 1, adjacent red, green, and blue pixels are illustrated, but example embodiments are not limited thereto.

Referring to FIG. 1, a CMOS image sensor 100 according to an example embodiment may include: a semiconductor substrate 10; a plurality of doping regions 20 formed partially on the top of the semiconductor substrate 10 and separated from each other; a first insulation layer 30 formed on the top of the semiconductor substrate 10; a conductor layer 40 formed so as to penetrate a part of the first insulation layer 30 and connect with the doping region 20; a light-sensing device 50 formed on the first insulation layer 30 and the conductor layer 40; an anti-reflection coating 70 formed on the light-sensing device 50; a color filter 60 formed on the anti-reflection coating 70 and including a red filter 60R, a green filter 60G, and blue filter 60B; a second insulation layer 90 covering the color filter 60; and a plurality of microlenses 80 formed on the second insulation layer 90 and positioned opposite to each pixel 60R, 60G, and 60b included in the color filter 60.

The plurality of doping regions 20 may be disposed so as to be opposite to each pixel 60R, 60G, and 60B included in the color filter 60.

However, in the CMOS image sensor 100 according to an example embodiment, constituents other than the light-sensing device 50 and the color filter 60 may be wholly or selectively omitted, without limitation.

Hereinafter, each constituent element of the CMOS image sensor 100 is described in detail.

The semiconductor substrate 10 may be formed of crystalline silicon or a compound semiconductor. If the substrate 10 is formed of the crystalline silicon, a silicon wafer may be used. As the semiconductor substrate 10, a semiconductor substrate doped with a p-type impurity may be used, but a semiconductor substrate doped with an n-type impurity may be used without limitation. The p-type impurity may include a Group III element such as boron (B) or aluminum (Al) and the n-type impurity may include a Group V element such as phosphorus (P), but other materials may be used as the p-type impurity and the n-type impurity according to the kind of the semiconductor substrate without limitation.

A plurality of doping regions 20 separated from each other are formed partially on the semiconductor substrate 10. The doping regions 20 may be doped with an n-type impurity, or doped with a p-type impurity without limitation. If a doping region 20 is doped with an n-type impurity, the doping region 20 may collect produced electrons and transfer them to the outside. Meanwhile, if the doping region 20 is doped with a p-type impurity, the doping region 20 may collect produced holes and transfer them to the outside.

A first insulation layer 30 is formed on the semiconductor substrate 10.

The first insulation layer 30 may be formed of an inorganic insulating material such as silicon oxide ($SiO_2$) or a low dielectric constant (low K) material such as SiC, SiCOH, SiCO, and SiOF, and the first insulation layer 30 may be provided as a single layer or multiple layers.

A part of the first insulation layer 30 is patterned and penetrated by a part adjacent to the doping region 20.

A conductor layer 40 is formed in the part where the first insulation layer 30 is patterned and penetrated so as to connect with the doping region 20.

The conductor layer 40 may be formed of a metal having low resistivity, for example aluminum (Al), copper (Cu), silver (Ag), and alloys thereof to reduce signal delay, but example embodiments are not limited thereto.

A light-sensing device 50 is formed on the first insulation layer 30 and the conductor layer 40.

The light-sensing device 50 may include a first electrode 51 connected with the conductor layer 40, a neutral surface layer 52 formed on the first electrode 51 and the first insulation layer 30, a photoelectric conversion layer 53 formed on the neutral surface layer 52, and a second electrode 55 formed on the photoelectric conversion layer 53. However, the neutral surface layer 52 may be omitted without limitation.

The first electrode 51 may include a plurality of the first electrodes 51 separated from each other, and each first electrode 51 may be positioned opposite to each pixel 60R, 60G, and 60B included in the color filter 60. Alternatively, the first electrode 51 may not be separated and may be provided as a single first electrode 51.

The first electrode 51 collects holes produced in the photoelectric conversion layer 53 and transfers them to the outside. The first electrode 51 may be formed of a transparent conductor such as ITO (indium tin oxide), indium doped ZnO (IZO), tin oxide ($SnO_2$), aluminum doped ZnO (AZO), gallium doped ZnO (GZO), and the like, or a barrier metal such as silver (Ag), aluminum (Al), copper (Cu), tungsten (W), Ti/TiW/Co, and the like, but is not limited thereto. Particularly, the first electrode 51 may be allowed to selectively collect holes by controlling a work function difference between the first electrode 51 and the second electrode 55, or by applying a desired (or alternatively predetermined) voltage from the outside to the first electrode 51, the second electrode 55, or a combination thereof.

The neutral surface layer 52 includes a material having surface energy of about 20 N/m to about 60 N/m, and the neutral surface layer 52 allows easy formation of the photoelectric conversion layer 53 on the neutral surface layer 52. The neutral surface layer 52 may be formed, for example, by a self-assembled monolayer (SAM) forming method using a material such as organosilane, organothiolate, and organophosphate, but example embodiments are not limited thereto.

A photoelectric conversion layer 53 may be formed on the neutral surface layer 52. Alternatively, if the neutral surface layer 52 is omitted, the photoelectric conversion layer 53 may be formed on the first electrode 51 and the first insulation layer 30.

Figure 2:
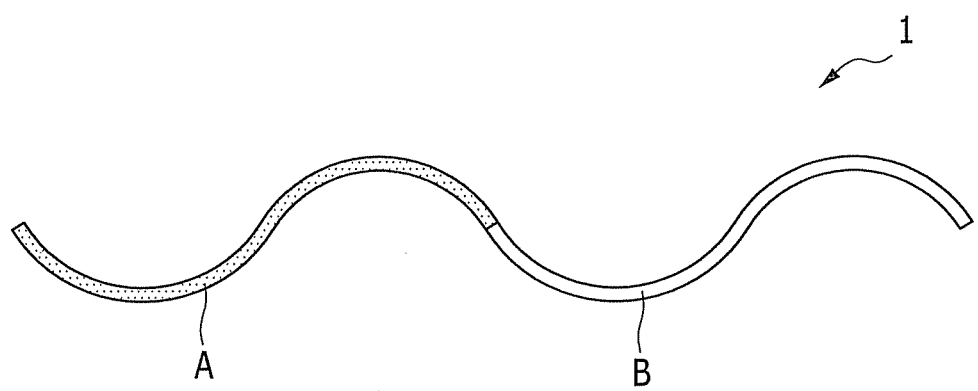
FIG. 2 is a schematic diagram showing the block copolymer included in the photoelectric conversion layer according to an example embodiment.

Referring to FIG. 2, the photoelectric conversion layer 53 includes a block copolymer including an electron donating block (B) and an electron accepting block (A). In the block copolymer, electron donating blocks (B) are deposited together and connected to the first electrode 51 and the second electrode 55, while the electron accepting (A) blocks are deposited together and connected to the first electrode 51 and the second electrode 55.

The electron donating block (B) may act as a p-type semiconductor by providing produced holes to the outside. The electron accepting block (A) may include a material having high electron affinity and act as an n-type semiconductor by providing produced electrons to the outside.

FIG. 2 is a schematic diagram showing a block copolymer 1 included in the photoelectric conversion layer 53. Referring to FIG. 2, the block copolymer 1 includes a polymer wherein the electron accepting block (A) and the electron donating block (B) are copolymerized.

When the electron accepting block (A) and the electron donating block (B) are copolymerized in the block copolymer 1, the block copolymer may be formed by negative ion polymerization or positive ion polymerization.

If the electron accepting block (A) and the electron donating block (B) are copolymerized and chemically bonded, the bonding strength between the blocks may be high. Furthermore, the stability of an interface between the electron donating block (B) and the electron accepting block (A), a pn junction interface, may be secured. Furthermore, the surface area of the pn junction interface may be effectively increased. Accordingly, the photoelectric conversion efficiency of the image sensor including the photoelectric conversion layer 53 may be improved, and the life-span characteristics and long-term reliability may be improved due to excellent stability.

In the photoelectric conversion layer 53, the electron donating block (B) and the electron accepting block (A) may be respectively deposited in parallel to the first electrode 51 and the second electrode 55, and connected to the first electrode 51 and the second electrode 55. Particularly, the electron donating block (B) and the electron accepting block (A) may be phase-separated as a lamellar type or a cylinder type to form the photoelectric conversion layer 53.

For example, by performing thermal annealing at a temperature above an order to disorder transition (ODT) temperature, or solvent annealing using a desired (or alternatively predetermined) solvent, after spin coating the block copolymer 1 on the neutral surface layer 52, the photoelectric conversion layer 53 may be formed such that the electron donating block (B) and the electron accepting block (A) included in the block copolymer 1 may be respectively deposited in parallel to the first electrode 51 and the second electrode 55 and connected to the first electrode 51 and the second electrode 55; however, the method of forming the photoelectric conversion layer 53 is not limited thereto.

If the electron donating block (B) and the electron accepting block (A) are respectively deposited in parallel to the first electrode 51 and the second electrode 55 and connected to the first electrode 51 and the second electrode 55, an electron-hole pair (exciton) produced in the electron donating block (B) and the electron accepting block (A) is separated at the interface between the electron donating block (B) and the electron accepting block (A), and the electron moves in a vertical direction to the second electrode 55 through the electron accepting block (A), and the hole moves in a vertical direction to the first electrode 51 through the electron donating block (B). Thereby, crosstalk, specifically crosstalk in the photoelectric conversion layer 53, may be reduced. Moreover, since the moving distance of the produced electron-hole pairs and the moving distance of the electron and the hole separated from the electron-hole pair may be reduced to decrease recombination of the electron and the hole, photoelectric current may be effectively generated to improve photoelectric conversion efficiency. Moreover, since the electron donating block (B) and the electron accepting block (A) are respectively deposited in parallel to the first electrode 51 and the second electrode 55, optical interference may be effectively reduced, and dark current may be effectively reduced in the photoelectric conversion layer 53 including the same, compared to a photoelectric conversion layer wherein the electron donating block (B) and the electron accepting block (A) are respectively arranged perpendicular to the first electrode and the second electrode.

Figure 3:
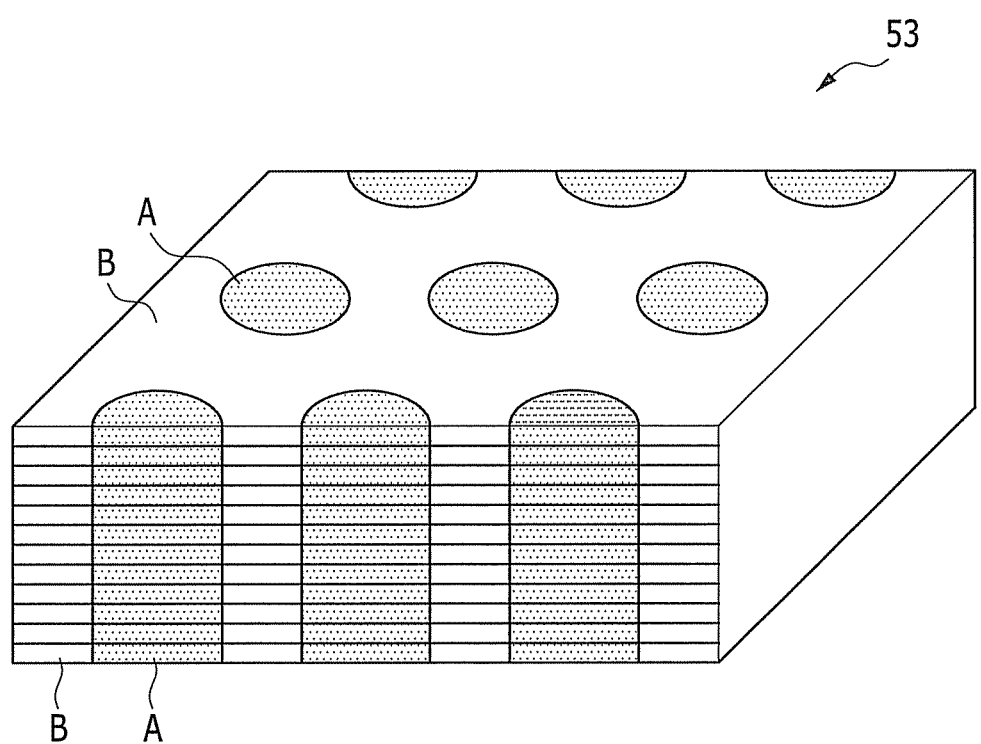
FIG. 3 is a perspective view showing the photoelectric conversion layer included in the image sensor of FIG. 1, according to an example embodiment.

FIG. 3 is a perspective view showing the photoelectric conversion layer 53 formed of the electron donating block (B) and the electron accepting block (A) phase-separated as a cylinder type. Although FIG. 3 shows a photoelectric conversion layer 53 wherein the block copolymer is phase-separated as a cylinder type, the shape of the photoelectric conversion layer 53 is not limited thereto.

Figure 4:
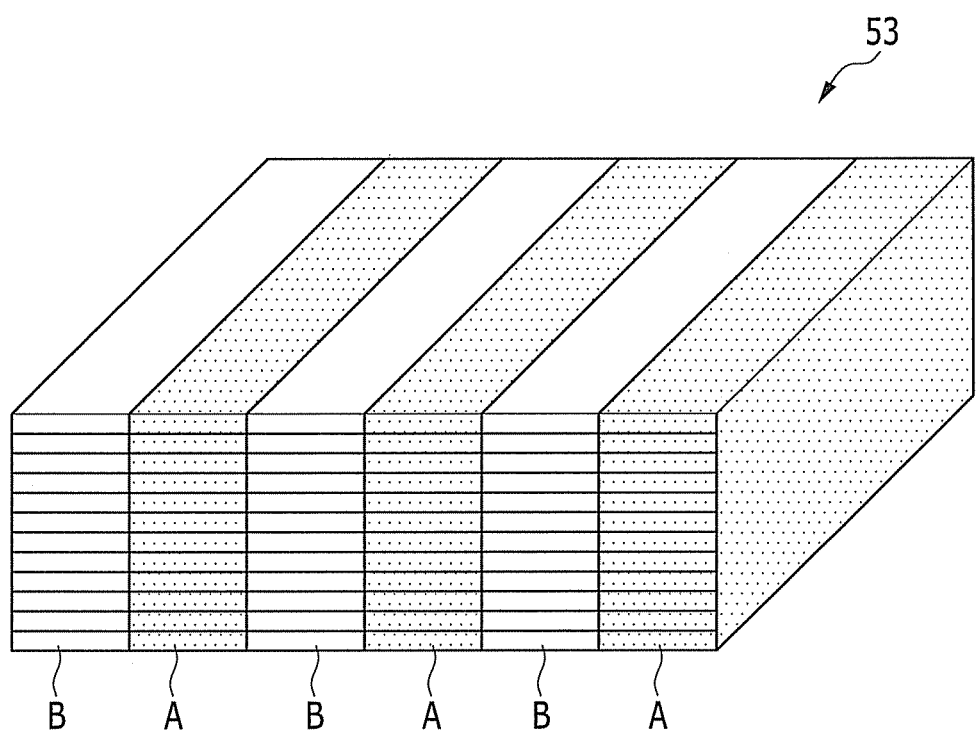
FIG. 4 is a perspective view showing the photoelectric conversion layer included in the image sensor of FIG. 1, according to another example embodiment.

FIG. 4 is a perspective view showing the photoelectric conversion layer 53 formed of the electron donating block (B) and the electron accepting block (A) phase-separated as a lamellar type. Although FIG. 4 shows a photoelectric conversion layer 53 wherein the block copolymer is phase-separated as a lamellar type, the shape of the photoelectric conversion layer 53 is not limited thereto.

Particularly, the electron donating block (B) may include polyaniline, polypyrrole, polythiophene, polythiazole, poly (p-phenylenevinylene), MEH-PPV (poly[2-methoxy-5-(2'-ethyl-hexyloxy)-1,4-phenylene vinylene), MDMO-PPV (poly(2-methoxy-5-(3,7-dimethyloctyloxy)-1,4-phenylene-vinylene), pentacene, poly(3,4-ethylenedioxythiophene) (PEDOT), metal phthalocyanine, poly(3-alkylthiophene), or a combination thereof, but is not limited thereto.

The electron donating block (B) may have a weight average molecular weight (Mw) of about $1\times10^3$ g/mol to about $1\times10^6$ g/mol. If the electron donating block (B) has a weight average molecular weight within the above range, a matrix may be effectively formed during phase separation.

The electron donating block (B) may have a polydispersity index (PDI) of about 1 to about 2. If the electron donating block (B) has a polydispersity index (PDI) within the above range, uniform phase separation may be achieved.

Particularly, the electron accepting block (A) may include fullerene (C60, C70, C74, C76, C78, C82, C84, C720, C860), 1-(3-methoxy-carbonyl)propyl-1-phenyl (6,6)C61 (PCBM), C71-PCBM, C84-PCBM, bis-PCBM, perylene, a perfluoropolymer, or a combination thereof, but is not limited thereto.

The electron accepting block (A) may have a weight average molecular weight (Mw) of about $1\times10^3$ g/mol to about $1\times10^6$ g/mol. If the electron accepting block (A) has a weight average molecular weight within the above range, a matrix may be effectively formed during phase separation.

The electron accepting block (A) may have a polydispersity index (PDI) of about 1 to about 2. If the electron accepting block (A) has a polydispersity index (PDI) within the above range, uniform phase separation may be achieved.

In the block copolymer, the ratio of the weight average molecular weight of the electron donating block (B) and the weight average molecular weight of the electron accepting block (A) may be about 2:8 to about 8:2, specifically about 2:8, about 3:7, about 4:6, about 5:5, about 6:4, about 7:3, or about 8:2. If the ratio of the weight average molecular weight of the electron donating block (B) and the weight average molecular weight of the electron accepting block (A) is within the above range, phase separation degree and morphology of each block may be easily controlled. Particularly, if the ratio of the weight average molecular weight of the electron donating block (B) and the weight average molecular weight of the electron accepting block (A) is about 2:8 to about 4:6 and about 6:4 to about 8:2, a photoelectric conversion layer wherein the electron donating block (B) and the electron accepting block (A) are phase-separated in a cylinder type may be easily formed. Meanwhile, if the ratio of the weight average molecular weight of the electron donating block (B) and the weight average molecular weight of the electron accepting block (A) is about 4:6 to about 6:4, a photoelectric conversion layer wherein the electron donating block (B) and the electron accepting block (A) are phase-separated as a lamellar type may be formed.

The block copolymer may include the electron donating block (B) and the electron accepting block (A) in the weight ratio of about 2:8 to about 8:2, specifically in the weight ratio of about 2:8, about 3:7, about 4:6, about 5:5, about 6:4, about 7:3, or about 8:2. If the weight ratio of the electron donating block (B) and the electron accepting block (A) is within the above range, phase separation degree and morphology of each block may be controlled. Particularly, if the weight ratio of the electron donating block (B) and the electron accepting block (A) is about 2:8 to about 4:6 and about 6:4 to about 8:2, a photoelectric conversion layer wherein the electron donating block (B) and the electron accepting block (A) are phase-separated in a cylinder type may be formed. Meanwhile, if the weight ratio of the electron donating block (B) and the electron accepting block (A) is about 4:6 to about 6:4, a photoelectric conversion layer wherein the electron donating block (B) and the electron accepting block (A) are phase-separated as a lamellar type may be formed.

The photoelectric conversion layer 53 may have a thickness of about 10 nm to about 5000 nm. If the photoelectric conversion layer 53 has a thickness within the above range, it may effectively transfer a produced charge. Particularly, the photoelectric conversion layer 53 may have a thickness of about 10 nm to about 1000 nm.

An second electrode 55 is formed on the photoelectric conversion layer 53.

The second electrode 55 performs a function of collecting electrons produced in the photoelectric conversion layer 53 and transferring them to the outside, and it may be formed of a transparent conductor such as ITO (indium tin oxide), indium doped ZnO (IZO), tin oxide ($SnO_2$), aluminum doped ZnO (AZO), gallium doped ZnO (GZO), and the like, but is not limited thereto. Particularly, the second electrode 55 may be allowed to selectively collect electrons by controlling a work function difference between the first electrode 51 and the second electrode 55, or applying a desired (or alternatively predetermined) voltage from the outside to the first electrode 51, the second electrode 55, or a combination thereof.

The information of the light sensed by the light-sensing device 50 is subsequently transferred by a transmission transistor (not shown).

An anti-reflection coating 70 is formed on the light-sensing device 50. Although FIG. 1 illustrates the anti-reflection coating 70, the anti-reflection coating 70 may be omitted without limitation.

The anti-reflection coating 70 may include an insulating material that reflects light less. For example, it may include: an oxide such as aluminum oxide ($Al_2O_3$), silicon oxide ($SiO_2$), titanium oxide ($TiO_2$ or $TiO_4$), magnesium oxide (MgO), cerium oxide ($CeO_2$), or a combination thereof; a nitride such as aluminum nitride (AlN), silicon nitride ($SiN_x$), titanium nitride (TiN), or a combination thereof; or an oxynitride such as aluminum oxynitride (AlON), silicon oxynitride (SiON), titanium oxynitride (TiON), or a combination thereof, and it may be provided as a single layer or multiple layers.

The anti-reflection coating 70 may have a thickness of, for example, about 5 nm to about 300 nm, specifically about 50 nm to about 80 nm.

The anti-reflection coating 70 is formed on the front side of the image sensor 100 that receives light so as to reduce light reflectance and increase selectivity at a specific wavelength region.

A color filter 60 is formed on the anti-reflection coating 70. The color filter 60 includes a red filter 60R, a green filter 60G, and a blue filter 60B. The red filter 60R, the green filter 60G, and the blue filter 60B are respectively positioned on the first electrodes 51 functioning for sensing each light and transferring them.

A second insulation layer 90 is formed on the color filter 60. The second insulation layer 90 removes a level difference due to the color filter 60 and planarizes it.

Microlenses 80 are formed on the second insulation layer 90 at a position corresponding to the color filters 60R, 60G, and 60B of each pixel. The microlens 80 collects light from the outside.

The CMOS image sensor according to some example embodiments may improve pn junction stability to improve the life-span characteristic and long-term reliability, and increase the surface area of the pn junction interface to improve photoelectric conversion efficiency, by including the photoelectric conversion layer containing the electron donating block (B) and the electron accepting block (A). Moreover, since the electron donating blocks (B) are deposited together and connected to the first electrode and the second electrode, and the electron accepting blocks (A) are deposited together and connected to the first electrode and the second electrode, crosstalk may be reduced to effectively sense a light signal.

While this disclosure has been described in connection with some example embodiments, it is to be understood that various modifications and equivalent arrangements may be made therein without departing from the spirit and scope of the appended claims.

What is claimed is:

1. An image sensor comprising:
    a light-sensing device including,
        a first electrode,
        a second electrode disposed opposite to the first electrode, and
        a photoelectric conversion layer positioned between the first electrode and the second electrode,
        the photoelectric conversion layer including a block copolymer including electron donating blocks and electron accepting blocks,
        the electron donating blocks are deposited together and connected to the first electrode and the second electrode, and
        the electron accepting blocks are deposited together and connected to the first electrode and the second electrode; and
    a color filter positioned on the second electrode of the light-sensing device.

2. The image sensor of claim 1, wherein the image sensor comprises:
    a plurality of color filters, and
    a plurality of first electrodes disposed opposite to each color filter, the plurality of first electrodes separated from each other.

3. The image sensor of claim 1, wherein
the electron donating blocks and the electron accepting blocks are respectively deposited in parallel to the first electrode and the second electrode.

4. The image sensor of claim 1, wherein
the photoelectric conversion layer includes the electron donating blocks and the electron accepting blocks that are phase-separated as a lamellar type or a cylinder type.

5. The image sensor of claim 1, wherein
the electron donating blocks include one of polyaniline, polypyrrole, polythiophene, polythiazole, poly(p-phenylenevinylene), MEH-PPV (poly[2-methoxy-5-(2'-ethyl-hexyloxy)-1,4-phenylene vinylene), MDMO-PPV (poly(2-methoxy-5-(3,7-dimethyloctyloxy)-1,4-phenylene-vinylene), pentacene, poly(3,4-ethylenedioxythiophene) (PEDOT), metal phthalocyanine, poly(3-alkylthiophene), and a combination thereof.

6. The image sensor of claim 1, wherein
the electron donating blocks include a weight average molecular weight (Mw) of about $1\times10^3$ g/mol to about $1\times10^6$ g/mol.

7. The image sensor of claim 1, wherein
the electron donating blocks include a polydispersity index (PDI) of about 1 to about 2.

8. The image sensor of claim 1, wherein
the electron accepting blocks include one of fullerene, C60, C70, C74, C76, C78, C82, C84, C720, C860, 1-(3-methoxy-carbonyl)propyl-1-phenyl (6,6)C61 (PCBM), C71-PCBM, C84-PCBM, bis-PCBM, perylene, a perfluoropolymer, and a combination thereof.

9. The image sensor of claim 1, wherein the electron accepting blocks include a weight average molecular weight (Mw) of about $1\times10^3$ g/mol to about $1\times10^6$ g/mol.

10. The image sensor of claim 1, wherein the electron accepting blocks include a polydispersity index (PDI) of about 1 to about 2.

11. The image sensor of claim 1, wherein
a ratio of a weight average molecular weight of the electron donating blocks and a weight average molecular weight of the electron accepting blocks is about 2:8 to about 8:2.

12. The image sensor of claim 1, wherein
the block copolymer includes the electron donating blocks and the electron accepting blocks in a weight ratio of about 2:8 to about 8:2.

13. The image sensor of claim 1, wherein the photoelectric conversion layer includes a thickness of about 10 nm to about 5000 nm.

14. The image sensor of claim 1, further comprising:
    a neutral surface layer between the first electrode and the photoelectric conversion layer, the neutral surface layer has surface energy of about 20 N/m to about 60 N/m.

15. The image sensor of claim 1, further comprising:
    an anti-reflection coating positioned between the light-sensing device and the color filter.

16. The image sensor of claim 1, further comprising:
a microlens positioned on the color filter.

17. The image sensor of claim 5, wherein
the electron donating blocks include one of polyaniline, polypyrrole, polythiophene, polythiazole, poly(p-phenylenevinylene), pentacene, poly(3,4-ethylenedioxythiophene) (PEDOT), metal phthalocyanine, poly(3-alkylthiophene), and a combination thereof.

18. The image sensor of claim 8, wherein
the electron accepting blocks include one of 1-(3-methoxycarbonyl)propyl-1-phenyl(6,6)C61(PCBM), C71-PCBM, C84-PCBM, bis-PCBM, perylene, a perfluoropolymer, and a combination thereof.

19. The image sensor of claim 14, wherein the neutral surface layer includes one of organosilane, organothiolate, and organophospate.

20. The image sensor of claim 1, wherein the electron donating blocks and the electron accepting blocks of the block copolymer define p-n junctions.

* * * * *